United States Patent
Chien

(10) Patent No.: US 9,485,671 B2
(45) Date of Patent: Nov. 1, 2016

(54) INTER-STAGE TEST STRUCTURE FOR WIRELESS COMMUNICATION APPARATUS

(71) Applicant: AZUREWAVE TECHNOLOGIES, INC., New Taipei (TW)

(72) Inventor: Huang-Chan Chien, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 345 days.

(21) Appl. No.: 14/192,561

(22) Filed: Feb. 27, 2014

(65) Prior Publication Data

US 2015/0241496 A1 Aug. 27, 2015

(51) Int. Cl.
*H04W 24/02* (2009.01)
*G01R 1/067* (2006.01)
*G01R 1/073* (2006.01)
*G01R 31/26* (2014.01)
*G01R 31/28* (2006.01)

(52) U.S. Cl.
CPC .............. *H04W 24/02* (2013.01); *G01R 1/067* (2013.01); *G01R 1/06772* (2013.01); *G01R 1/073* (2013.01); *G01R 31/2601* (2013.01); *G01R 31/2886* (2013.01)

(58) Field of Classification Search
CPC .. G01R 1/06772; G01R 1/067; G01R 1/073; G01R 31/2601; G01R 31/2886
USPC .................................................... 324/754.03
See application file for complete search history.

(56) References Cited

U.S. PATENT DOCUMENTS

| | | | | |
|---|---|---|---|---|
| 5,465,008 A * | 11/1995 | Goetz | ............... | H01L 21/67121 257/691 |
| 6,856,131 B2 * | 2/2005 | Miyazawa | ............... | H01Q 7/00 324/252 |
| 8,179,329 B2 * | 5/2012 | Kato | ................ | G06K 19/07749 343/726 |
| 8,466,583 B2 * | 6/2013 | Karalis | ..................... | H03H 7/40 307/104 |
| 8,802,496 B2 * | 8/2014 | Shibuya | ................ | H01L 21/563 257/691 |
| 2004/0028888 A1 * | 2/2004 | Lee | ........................ | H05K 1/024 428/304.4 |
| 2007/0007342 A1 | 1/2007 | Cleeves et al. | | |
| 2007/0228403 A1 * | 10/2007 | Choi | ................. | H01L 27/14618 257/98 |
| 2012/0299798 A1 | 11/2012 | Leisten | | |

FOREIGN PATENT DOCUMENTS

| | | |
|---|---|---|
| JP | 2007-59880 A | 3/2007 |
| TW | 201323896 A1 | 6/2013 |
| TW | 201327699 A1 | 7/2013 |

* cited by examiner

*Primary Examiner* — Jermele M Hollington
*Assistant Examiner* — Christopher McAndrew
(74) *Attorney, Agent, or Firm* — Li & Cai Intellectual Property (USA) Office

(57) ABSTRACT

An inter-stage test structure for a wireless communication apparatus is provided. The wireless communication apparatus has a unit under test (UUT) and a next-stage component connected to the UUT through a signal wire. The inter-stage test structure is disposed on the signal wire and electrically connects the UUT to the next-stage unit component. The inter-stage test structure includes an upper board, a lower board, and an intermediate layer. The intermediate layer is disposed between the upper board and the lower board. The intermediate layer includes a first region and a second region defined thereon. The first region has an air cavity for generating an air impedance. The second region has an impedance adjusting cavity for generating an adjustable impedance. Accordingly, the inter-stage test structure can detect the condition of the UUT of the wireless communication apparatus based on the air impedance and the adjustable impedance.

7 Claims, 6 Drawing Sheets

INTER-STAGE TEST STRUCTURE FOR WIRELESS COMMUNICATION APPARATUS

BACKGROUND

1. Technical Field

The present disclosure relates to an inter-stage test structure, in particular, to an inter-stage test structure detecting the condition of a unit under test (UUT) disposed in a wireless communication apparatus.

2. Description of Related Art

Wireless communication technology has been widely used in nowadays and has become a design tendency for mobile devices. In general, wireless communication components can be integrated in a system-on-chip (SOC), enables the wireless communication circuit to be miniaturized and modularized, as a result all of the require functional components can be integrated into a single chip forming a wireless communication device, complying with the modern mobile product trend.

However, there are too many functional components disposed in the wireless communication device. When a specific component in the wireless communication device is defected, currently it is in general not easy for a conventional testing instrument to detect which component is defected. Traditionally, in order to ensure that the wireless communication device operates normally, when detected that the wireless communication device has poor performance or when a certain element is defected, the entire SOC is scrapped, which is wasteful.

SUMMARY

Accordingly, an exemplary embodiment of the present disclosure provides an inter-stage test structure for a wireless communication apparatus, which can detect the condition of the UUT of the wireless communication apparatus allowing a user to replace the UUT when the inter-stage test structure detects that the UUT is detected or is damaged. As a result, the user only has to replace the defected or damaged UUT, rather than scrapped the entire wireless communication apparatus, thereby can considerably reduce the associated manufacturing costs.

According to one exemplary embodiment of the present disclosure, an inter-stage test structure for a wireless communication apparatus is provided. The wireless communication apparatus has a unit under test (UUT), a first ground wire, a signal wire, a second ground wire, and a next-stage component. The UUT is electrically connected to the next-stage component through the first ground wire, the signal wire, and the second ground wire, respectively. The inter-stage test structure includes an upper board, a lower board, and an intermediate layer. The lower board has a first ground pad, a first signal pad, and a second ground pad. The first ground pad electrically connects a first ground terminal of the UUT to a first ground terminal of the next-stage component through the first ground wire. The first signal pad electrically connects a signal terminal of the UUT to a signal terminal of the next-stage component through the signal wire. The second ground pad electrically connects to a second ground terminal of the UUT to a second ground terminal of the next-stage component. The intermediate layer is disposed between the upper board and the lower board. The intermediate layer has a first region and a second region defined thereon, wherein the first region is defined in adjacent to the second region. The first region has an air cavity formed between the intermediate layer and the lower boar, and air inside of the air cavity generates an air impedance. The second region has an impedance adjusting cavity formed between the intermediate layer and the lower board. The impedance adjusting cavity comprises of a conductive paste, a ground plate, a substrate layer, and a metal plate. The conductive paste is disposed on the lower board and is configured for electrically connecting the first ground pad to the second ground pad. The ground plate, the substrate layer, and the metal plate are sequentially disposed on the conductive paste. The substrate layer has a predefined thickness such that air flow inside the impedance adjusting cavity generates an adjustable impedance.

To sum up, the present disclosure provides an inter-stage test structure for a wireless communication apparatus, which can detect the condition for the UUT disposed in the wireless communication apparatus based on the impedance ratio between the air impedance and the adjustable impedance generated.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1A:
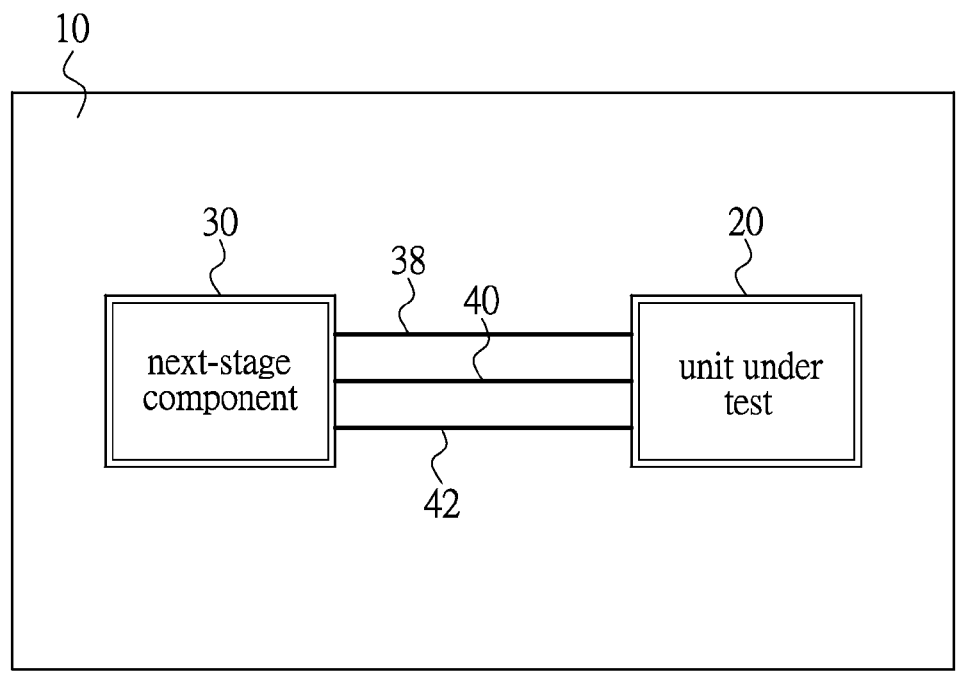
FIG. 1A is a schematic diagram of a wireless communication apparatus provided in accordance to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Figure 1B:
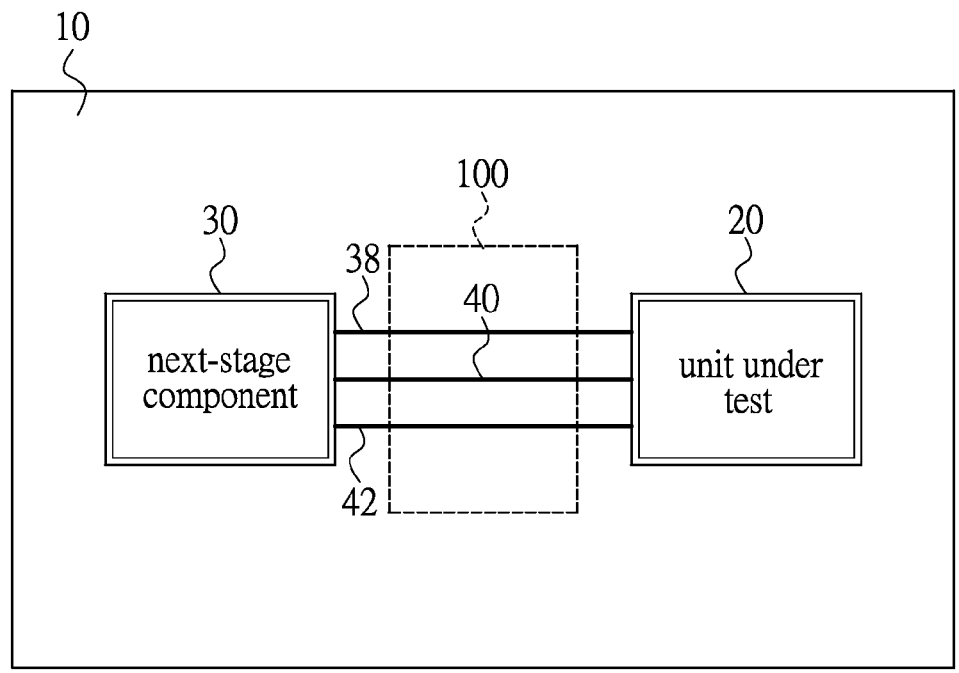
FIG. 1B is a diagram illustrating the operation of an inter-stage test structure for use in testing the UUT of the wireless communication apparatus provided in accordance to an exemplary embodiment of the present disclosure.

Please refer to FIG. 1A and FIG. 1B at same time, in which FIG. 1A shows a schematic diagram of a wireless communication apparatus provided in accordance to an exemplary embodiment of the present disclosure. FIG. 1B shows a schematic diagram illustrating the operation of an inter-stage test structure for use in testing the unit under test (UUT) of the wireless communication apparatus provided in accordance to an exemplary embodiment of the present disclosure.

As shown in FIG. 1A and FIG. 1B, a wireless communication apparatus 10 includes a unit under test (UUT) 20, a next-stage component 30, a first ground wire 38, a signal wire 40, and a second ground wire 42. The UUT 20 is electrically connected to the next-stage component 30 the first ground wire 38, the signal wire 40, and the second ground wire 42, respectively. In the instant embodiment, the UUT 20 is a component being disposed in the wireless communication apparatus and the UUT 20 is configured to electrically connect to a preceding-stage component (not shown in figure). The next-state component 30 is the next respective stage component in view of the UUT 20. When a user would like to check and detect the condition of the UUT 20, the user can place the inter-stage test structure 100 between the UUT 20 and the next-stage component 30 (i.e., place the inter-stage test structure 100 on the first ground wire 38, the signal wire 40, and the second ground wire 42), as depicted in FIG. 1B. Certainly, if the user wants to check and detect the condition of the next-stage component 30, the user may place the inter-stage test structure 100 between the next-stage component 30 and the respective next stage component. For clarity, the following description provided further elaborates on the operation of the inter-stage test structure 100 disposed between the UUT 20 and the next-stage component 30 for use of checking and detecting the condition of the UUT 20.

Figure 2A:
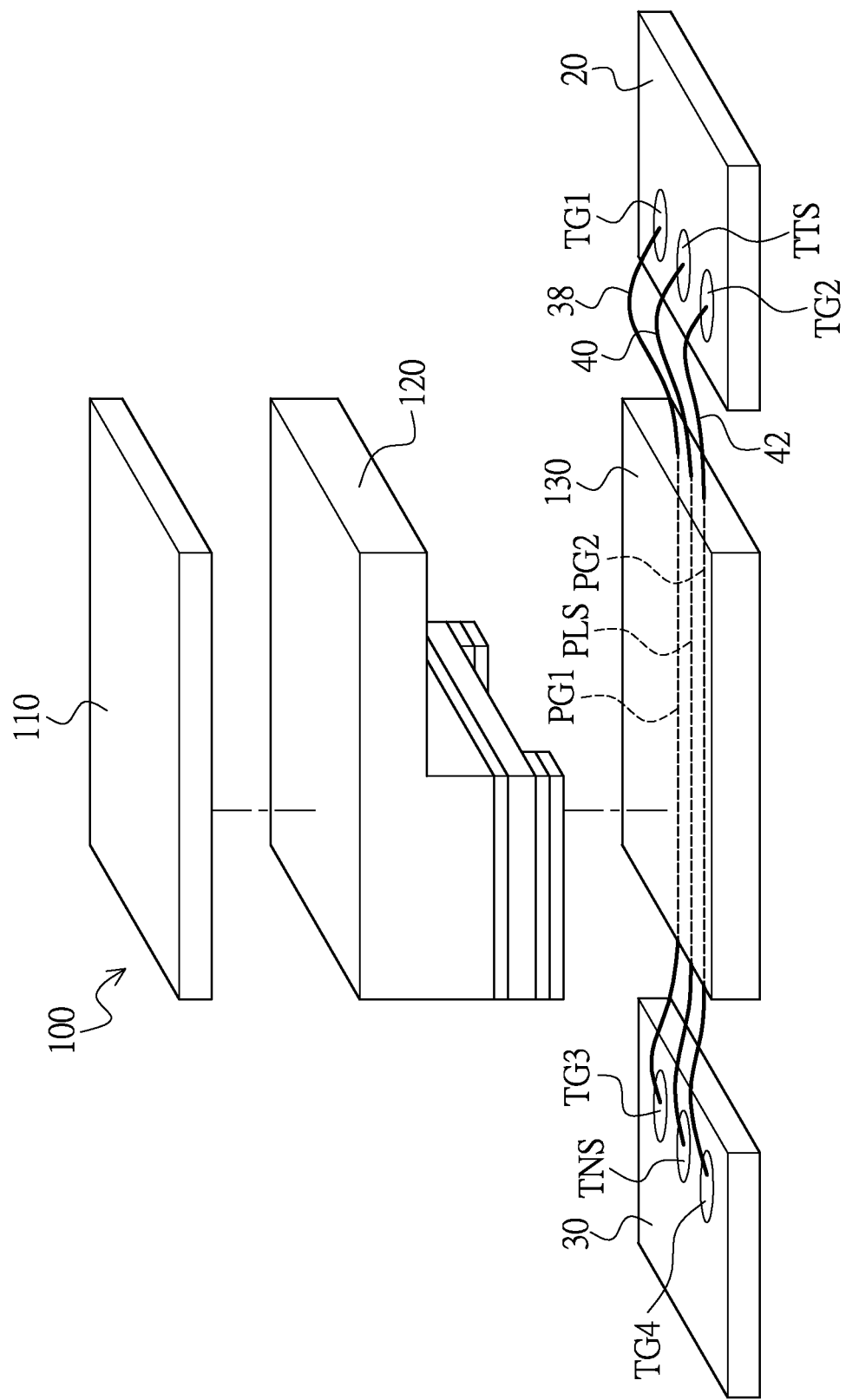
FIG. 2A is an explosive view illustrating an inter-stage test structure provided in accordance to an exemplary embodiment of the present disclosure.

Next, please refer to FIG. 2A in conjunction with FIG. 1B. FIG. 2A shows an explosive view illustrating an inter-stage test structure provided in accordance to an exemplary embodiment of the present disclosure. As shown in FIG. 2A, the UUT 20 is electrically connected to the next-stage component 30 through the first ground wire 38, the signal wire 40, and the second ground wire 42. The inter-stage test structure 100 includes an upper board 110, a lower board 130, and an intermediate layer 120. A first ground pad PG1 of the lower board 130 electrically connect a first ground terminal TG1 of the UUT 20 to a first ground terminal TG3 of the next-stage component 30 through the first ground wire 38. A first signal pad PLS of the lower board 130 electrically connects to a signal terminal TTS of the UUT 20 to a signal terminal TNS of the next-stage component 30 through the signal wire 40. A second ground pad PG2 of the lower board 130 electrically connects to a second ground terminal TG2 of the UUT 20 to a second ground terminal TG4 of the next-stage component 30. The intermediate layer 120 is disposed between the upper board 110 and the lower board 130, such that the inter-stage test structure 100 is in a Ground-Signal-Ground (GSG) structure configuration. In the instant embodiment, the first ground pad PG1, the first signal pad PLS, and the second ground pad PG2 can be disposed inside the lower board 130 and configured to respectively connect the first ground wire 38, the signal wire 40, and the second ground wire 42, as shown in FIG. 2A. In another embodiment, the first ground pad PG1, the first signal pad PLS, and the second ground pad PG2 may be disposed and exposed on the bottom of the lower board 130 for convenient connection with the first ground wire 38, the signal wire 40, and the second ground wire 42, respectively. It shall be noted that the exact configuration and the exact arrangement of the first ground pad PG1, the first signal pad PLS, the second ground pad PG2, the first ground wire 38, the signal wire 40, and the second ground wire 42 can be design and configured according to the exact implementation of the inter-stage test structure and the practical application requirement and shall not be limited to the examples provided by the present disclosure.

The user can further electrically connect the inter-stage test structure 100 to an external measuring device (not shown in FIG. 2A) for measuring and detecting the instant condition of the UUT 20. For example, the external measuring device can be configured to electrically connect the first ground pad PG1, the first signal pad PLS, and the second ground pad PG2 of the lower board 130 and detect whether the UUT 20 is defected or is damaged. In another embodiment, the upper board 110 can be designed to have three contact pads disposed thereon and the three contact pads are configured to electrically connected to the first ground pad PG1, the first signal pad PLS, and the second ground pad PG2 respectively, such that the external measuring device can be configured to electrically connect the three contact pads on the upper board 110 and detect whether the UUT 20 is defected or is damaged. The present disclosure is not limited thereto. Additionally, in the present disclosure, the upper board 110 and the lower board 130 can be implemented by a printed circuit board (PCB). The intermediate layer 120 can comprise of an insulation material, preferably comprise of plastic material, but not limited hereto.

Figure 2B:
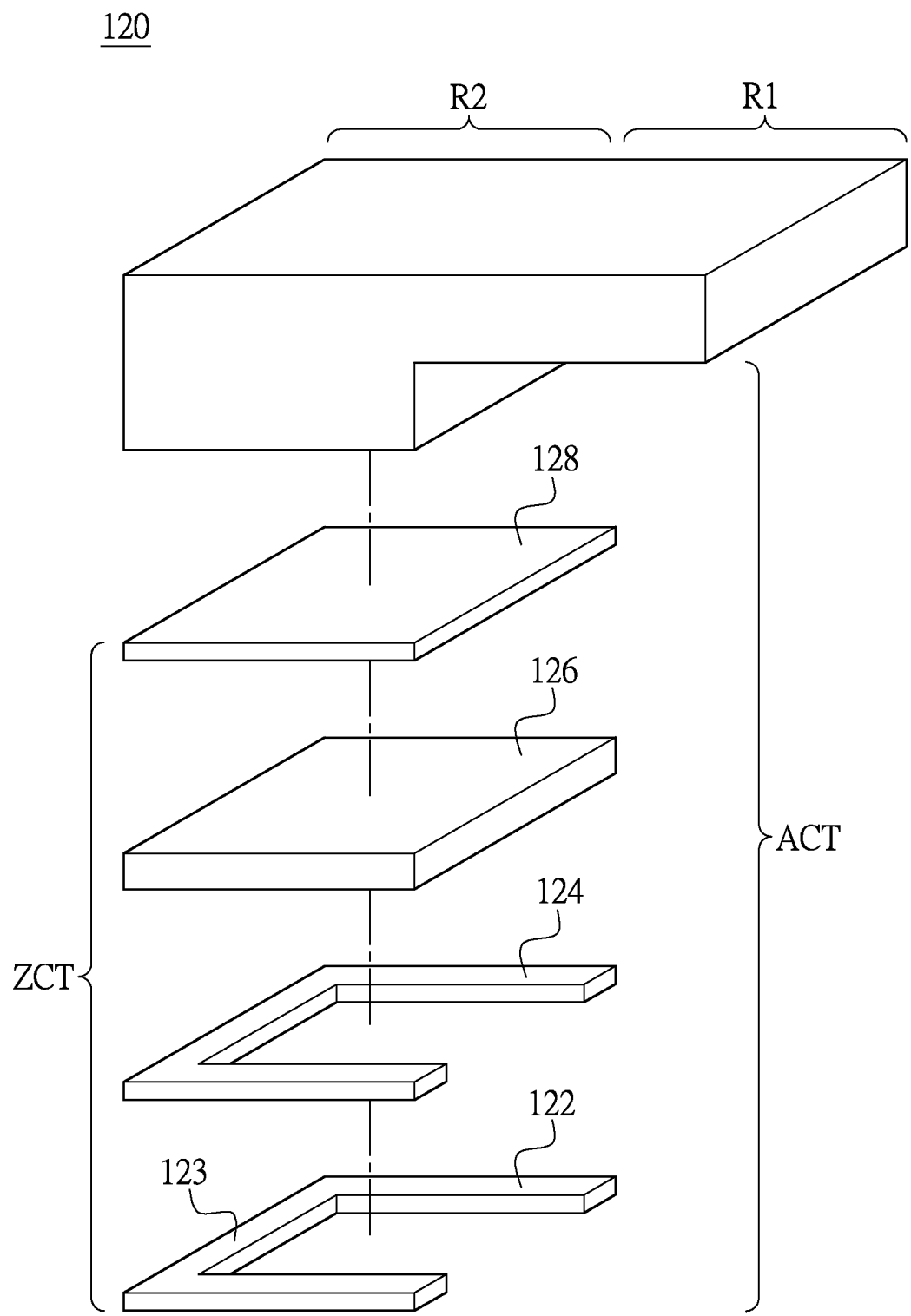
FIG. 2B is an explosive view illustrating the structure of an intermediate layer provided in accordance to an exemplary embodiment of the present disclosure.

Next, please refer to FIG. 2B in conjunction with FIG. 2A. FIG. 2B is an explosive view illustrating the structure of an intermediate layer provided in accordance to an exemplary embodiment of the present disclosure. The intermediate layer 120 has a first region R1 and a second region R2 defined thereon, wherein the first region R1 is in adjacent to the second region R2. In instant embodiment, the area of the first region R1 is the same as that of the second region R2 to prevent the generation of unnecessary parasitic capacitance affecting the detection result of the inter-stage test structure 100. However, if the parasitic capacitance is too small and can be neglected, such that the impact of the parasitic capacitance can be ignored, then it is not necessary to configure the area of the first region R1 to be the same as the second region R2. The present disclosure is not limited thereto.

The first region R1 has an air cavity ACT defined therein. Specifically, the first region R1 has the air cavity ACT formed between the intermediate layer and the lower board and air inside the air cavity ACT c generates an air impedance. In the instant embodiment, the air impedance is configured to be 50 ohms, so that the signals transmitted within the inter-stage test structure 100 do not interfere with each other easily. Certainly, the air impedance can be configured to be other value depending upon the operational requirement of the inter-stage test structure 100, and the instant disclosure is not limited thereto. The second region R2 has an impedance adjusting cavity ZCT formed between the intermediate layer and the lower board. The impedance adjusting cavity ZCT comprises a conductive paste 122, a ground plate 124, a substrate layer 126, and a metal plate 128. The conductive paste 122 is applied onto an upper surface of the lower board 130 for electrically connecting the ground plate 124 to the first ground pad PG1 and the second ground pad PG2. The ground plate 124, the substrate layer 126, and the metal plate 128 are sequentially disposed on the conductive paste 122. The substrate layer 126 has a predefined thickness configured for generating an adjustable impedance, i.e., the adjustable impedance is generated according to the predefined thickness. The inter-stage test structure 100 has an equivalent impedance, which is determined by the air impedance and the adjustable impedance generated.

In the instant embodiment, the conductive paste 122 can be disposed around the second region R2 and not disposed on the first region R1. The conductive paste 122 as shown in FIG. 2B is configured to be an inclined U-shape. The shape of the ground plate 124 is the same as the conductive paste 122 (i.e., the shape of the ground plate 124 and the conductive paste 122 are all configured to be inclined U-shaped structure). The conductive paste 122 is configured to electrically connect the ground plate 124 to the first ground pad PG1 and the second ground pad PG2 but does not connect the ground plate 124 to the first signal pad PLS so as to reduce the impact of the conductive paste 122 and the ground plate 124 on the signal wire 40 being electrically connected to the first signal pad PLS. Of course, the shape of the ground plate 124 and the conductive paste 122 can be configured to be other regular or irregular shapes and the present disclosure is not limited thereto.

The first ground pad PG1 and the second ground pad PG2 can be disposed on different surfaces of the lower board 130 with the first signal pad PLS, such that the ground plate 124 electrically connects to the first ground pad PG1 and the second ground pad PG2 but does not connect to the first signal pad PLS. In another embodiment, the shape of the conductive paste 122 can be designed and configured not to connect the first signal pad PLS (e.g., a protrusion portion 123 of the conductive paste 122 is designed to be out of the contact area of the first signal pad PLS on the lower board 130). The instant disclosure is not limited thereto.

The lower board 130, the conductive paste 122, the ground plate 124, the substrate layer 126, the metal plate 128, the intermediate layer 120, and the upper board 110 can be bonded using adhesives or other known boning technique. Moreover, those skilled in the art shall be able to select the appropriate adhesive material as well as the adhesives bonding implementation for the described bonding process, and further descriptions are hereby omitted.

In addition, the ground plate 124 and the metal plate 128 are disposed in parallel, such that capacitance can be formed between the ground plate 124, and the metal plate 128, thereby generate the adjustable impedance. It is known in the art that capacitance of an element is inversely proportional to the impedance of the element. Hence, the thicker the substrate layer 126 is, the higher the adjustable impedance becomes. Similarly, the thinner the substrate layer 126 is, the lower the adjustable impedance becomes. Certainly, the adjustable impedance generated can be adjusted by changing material used for the substrate layer 126. In the instant embodiment, the substrate layer 126 comprises of fiber glass material such as FR-4 or other equivalent material and the instant disclosure is not limited thereto.

Accordingly, the user can design the thickness of the substrate layer 126 according to the operating frequency band of the UUT 20 to generate the desire adjustable impedance so that the equivalent impedance of the inter-stage test structure 100 generated based on constant air impedance and the designed adjustable impedance matches an equivalent impedance of the UUT within the operating frequency band. Thereafter, the user can use the external measuring device electrically connected to the inter-stage test structure 100 and detect the instant condition of the UUT 20.

Figure 3A:
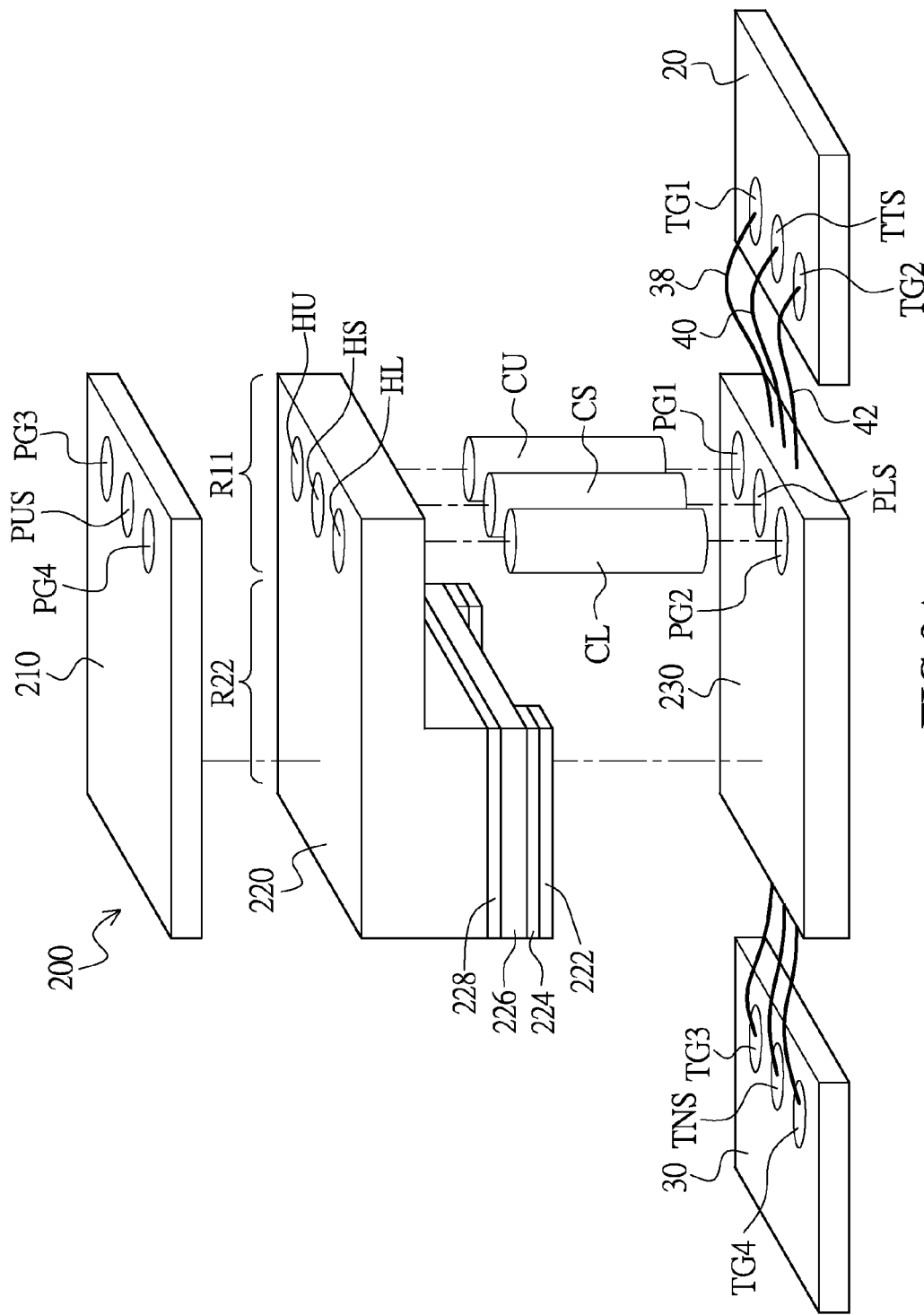
FIG. 3A is an explosive view illustrating an inter-stage test structure provided in accordance to another exemplary embodiment of the present disclosure.
Figure 3B:
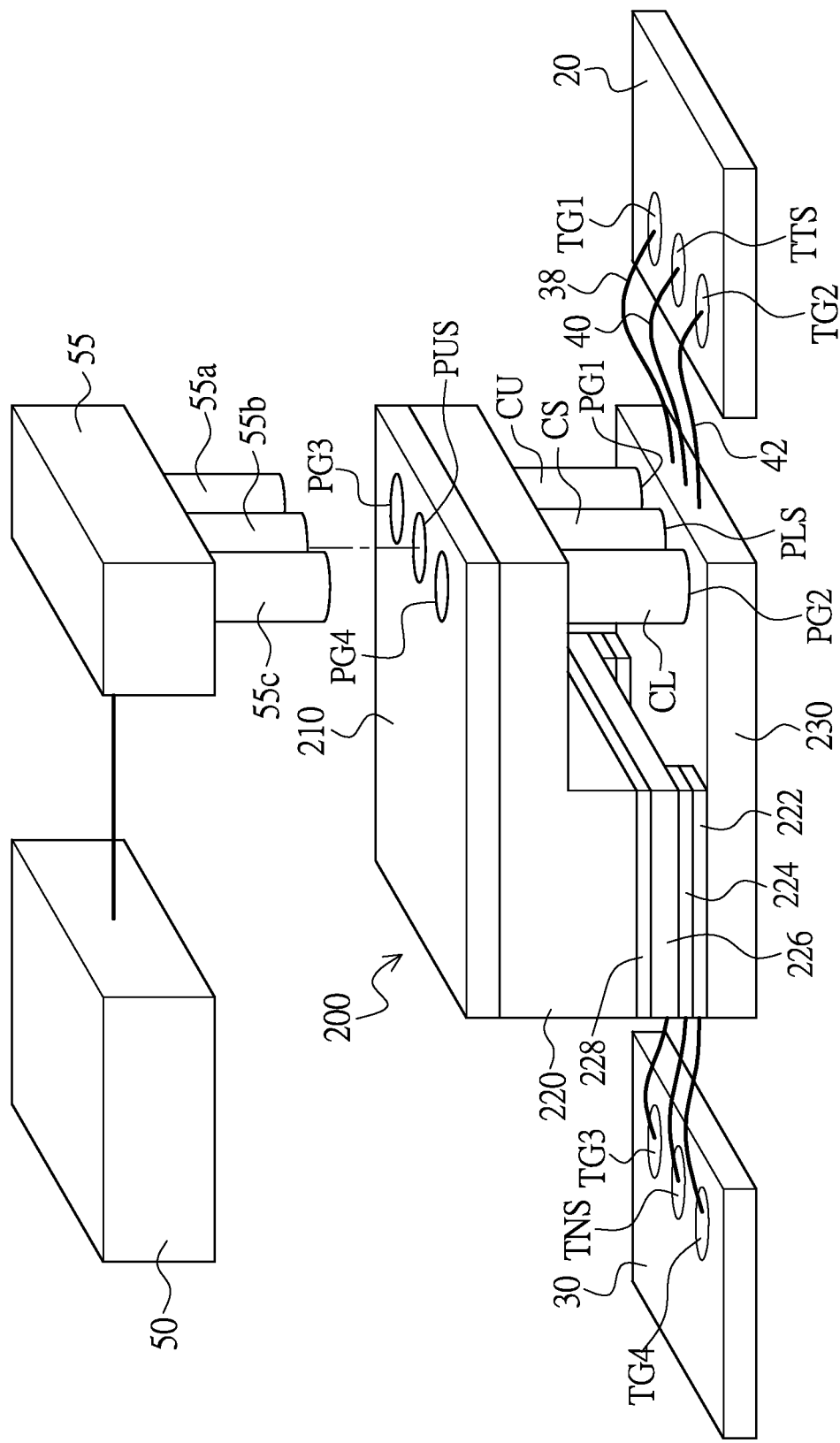
FIG. 3B is a side view illustrating an inter-stage test structure provided in accordance to another exemplary embodiment of the present disclosure.

Next, please refer to FIG. 3A and FIG. 3B at same time, in which FIG. 3A shows an explosive view illustrating an inter-stage test structure provided in accordance to another exemplary embodiment of the present disclosure. FIG. 3B shows a side-view illustrating an inter-stage test structure provided in accordance to another exemplary embodiment of the present disclosure. As shown in FIG. 3A and FIG. 3B, an inter-stage test structure 200 includes an upper board 210, an intermediate layer 220, a lower board 230, a first conductor CU, a signal conductor CS, and a second conductor CL. The related structures and connections associated with the upper board 210, the intermediate layer 220, and the lower board 230 of the inter-stage test structure 200 are essentially the same as the upper board 110, the intermediate layer 120, and the lower board 130 described for the inter-stage test structure 100.

The difference between the inter-stage test structure 200 and the inter-stage test structure 100 are described as follows. The upper board 210 has a third ground pad PG3, a second signal pad PUS, and a fourth ground pad PG4 disposed thereon. The lower board 230 has the first ground pad PG1, a first signal board pad PLS, and a second ground pad PG2. The intermediate layer 220 further has a first through-hole HU, a signal through-hole HS, and a second through-hole HL formed thereon. The third ground pad PG3 is disposed opposite to the position of the first ground pad PG1. The first conductor CU is disposed in the first through-hole HU to electrically connect the third ground pad PG3 to the first ground pad PG1. The second signal pad PUS is disposed opposite to the position of the first signal pad PLS. The signal conductor CS is disposed in the signal through-hole HS to electrically connect the second signal pad PUS to the first signal pad PLS. The fourth ground pad PG4 is disposed opposite to the position of the second ground pad PG2. The second conductor CL is disposed in the second through-hole HL to electrically connect the fourth ground pad PG4 to the second ground pad PG2.

In the instant embodiment, the first through-hole HU, the signal through-hole HS, and the second through-hole HL are respectively disposed in the first region R11. The second region R22 of the intermediate layer 220 has a conductive paste 222, a ground plate 224, a substrate layer 226, and a metal plate 228 disposed thereon. The relationship between the first region R11 and the second region R22 defined on the intermediate layer 220 is the same as that between the first region R1 and the second region R2 of the intermediate layer 120. In addition, the related structures and connections associated with the conductive paste 222, the ground plate 224, the substrate layer 226, and the metal plate 228 are essentially the same as the conductive paste 122, the ground plate 124, the substrate layer 126, and the metal plate 128 described in the aforementioned embodiment, and further descriptions are hereby omitted.

Next, user can electrically connect a probing component 55 to the third ground pad PG3, the second board pad PUS, and the fourth ground pad PG4 of the inter-stage test structure 200 and the probing component 55 is further configured to electrically connect the measuring device 50 so that the measuring device 50 can detect the instant condition of the UUT 20, as shown in FIG. 3B. In the instant embodiment, the probing component 55 can be a probe and has a first ground probe 55a, a signal probe, and a second ground probe 55c (i.e., three-rod probe or GSG probe). The first ground probe 55a is electrically connected to the third ground pad PG3. The signal probe 55b is electrically connected to the second signal pad PUS. The second ground probe 55c is electrically connected to the fourth ground pad PG4. The user can use the measuring device 50 to measure and detect the condition of the UUT 20 by electrically connecting the probing component 55 of the measuring device 50 to the inter-stage test structure 200, i.e., measure and detect the condition of the UUT 20 using a GSG structure. The exact structure and structure of the probing element 55 can be configured according to the measuring requirement of the UUT 20, and the instant embodiment is not limited thereto.

Moreover, when the inter-stage test structure 200 does not have the first conductor CU, the signal conductor CS, and the second conductor CL, such that the third ground pad PG3 is not electrically connected to the first ground pad PG1, the second signal pad PUS is not electrically connected to the first signal pad PLS, and the fourth ground pad PG4 is not electrically connected to the second ground pad PG2.

The third ground pad PG3, the second signal ground PUS, and the fourth ground pad PG4 can be implemented by a through-hole. Such that, the user can use the first ground probe 55a to electrically connect with the first ground pad PG1 by inserting the first ground probe 55a through the third ground pad PG3 and the first through-hole HU. The user uses the signal probe 55b to electrically connect with first signal pad PLS by inserting the signal probe 55b through the second signal pad PUS and the signal through-hole HS. The user uses the second ground probe 55c to electrically connect the second ground pad PG2 by inserting the second ground probe 55c through the fourth signal pad PG4 and the second through-hole HL. Accordingly, the user can use the measuring device 50 to measure and detect the condition of the UUT 20 by electrically connecting the probing component 55 of the measuring device 50 to the inter-stage test structure 200, i.e., measure and detect the condition of the UUT 20 using a GSG structure.

In order to describe operation of using the inter-stage test structure 200 to detect and measure the condition of the UUT 20. The following description further elaborates an operation of the inter-stage test structure 200 before connecting the probing component 55 of the measuring device 50 to the inter-stage test structure 200, wherein the air impedance and the adjustable impedance of the inter-stage test structure 200 are configured to be 50 ohms, and an operation of the inter-stage test structure 200 when the probing component 55 of the measuring device 50 is electrically connected to the inter-stage test structure 200, wherein the air impedance of the inter-stage test structure 200 is configured to be 50 ohms while the adjustable impedance of the inter-stage test structure 200 is configured to be 24 ohms. The measuring device 50 can further measure and detect the condition of the UUT 20 operating in 2.4 Ghz/5 Ghz Industrial Scientific Medical (ISM) Band.

Figure 4A:
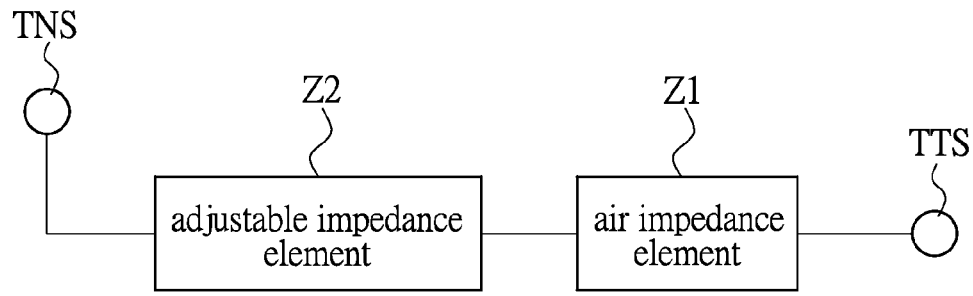
FIG. 4A is an equivalent circuit diagram of an inter-stage test structure before a probing component connected thereto provided in accordance to another exemplary embodiment of the present disclosure.
Figure 4B:
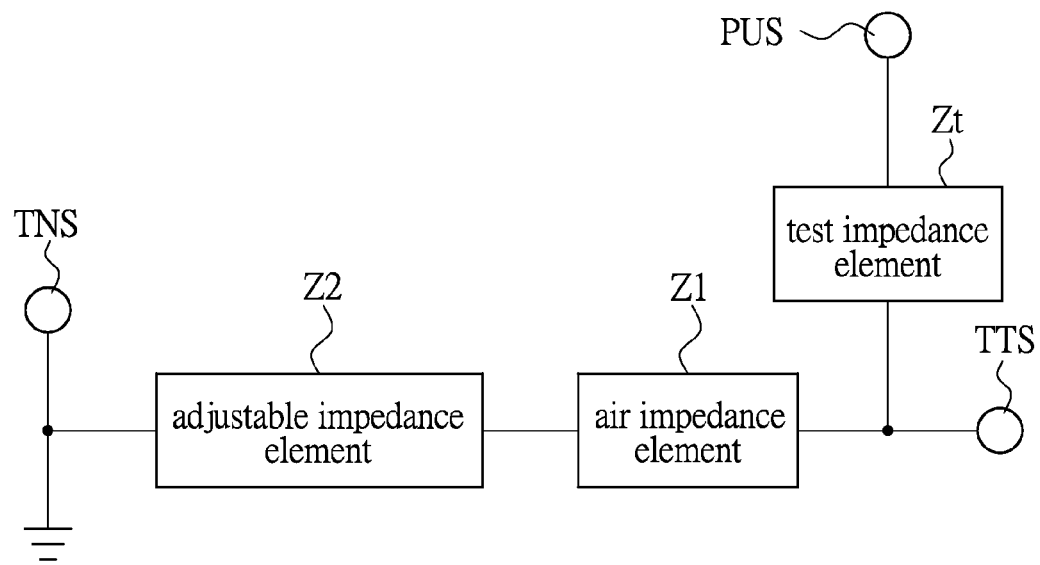
FIG. 4B is an equivalent circuit diagram of an inter-stage test structure electrically connected to a probing element provided in accordance to another exemplary embodiment of the present disclosure.

Please refer FIG. 4A and FIG. 4B, in which FIG. 4A shows an equivalent circuit diagram an inter-stage test structure before a probing component connected thereto a provided in accordance to another exemplary embodiment of the present disclosure. FIG. 4B shows an equivalent circuit diagram of an inter-stage test structure electrically connected to a probing component electrically connected provided in accordance to another exemplary embodiment of the present disclosure. As shown in FIG. 4A, before the user connects the probing component 55 to the inter-stage test structure 200, the equivalent circuit of the inter-stage test structure 200 comprise of an air impedance element Z1 and an adjustable impedance element Z2. The air impedance element Z1 has one end thereof electrically connected to one end of the adjustable impedance element Z2 and the other end thereof electrically connected to the signal terminal TTS of the UUT 20 (i.e., electrically connected to the UUT 20). The other end of the adjustable impedance element Z2 is electrically connected to the signal terminal TNS of the next-stage component 30 (i.e., electrically connected to the next-stage component 30). In the instant disclosure, the air impedance and the adjustable impedance are both configured to be 50 ohms (i.e., the equivalent impedance of the inter-stage test structure 200 is 50 ohms), as shown in FIG. 4A.

When the user electrically connect the probing component 55 to the inter-stage test structure 200 providing a 50-ohms test impedance (i.e., the test impedance is the same as the air impedance), the first ground probe 55a is electrically connected to the first ground pad PG1 through the third ground pad PG3, the signal probe 55b is electrically connected to the first signal pad PLS through the second signal pad PUS, and the second ground pad 55c is electrically connected to the second ground pad PG2 through the fourth ground pad PG4 (not shown in FIG. 4B).

At this time, the equivalent circuit of the inter-stage test structure 200 comprises an air impedance element, an adjustable impedance element, and a test impedance element. The air impedance element Z1 has one end thereof electrically connected to one end of the adjustable impedance element Z2 and the other end of the air impedance Z1 electrically connected to the signal terminal TTS of the UUT 30 (i.e., electrically connected to the UUT 20) and one end of the test impedance element Zt. The other end of the test impedance element Zt is electrically connected to the first board pad PUS modeling the connection between the first board pad PUS and the external measuring device 50. The other end of the adjustable impedance element Z2 is connected to a ground (i.e., modeling an open circuit connection between the adjustable impedance element Z2 and the next-stage component 30). In the instant embodiment, the air impedance is still 50 ohms but the adjustable impedance Z2 changes from 50 ohms to 240 hms such that the equivalent impedance of the inter-stage test structure 200 is 24/50 ohms), as shown in FIG. 4B.

Next, the measuring device 50 can further detect the instant condition the UUT 20 by measuring signals outputted by the UUT 20. For example, if signals outputted from the UUT 20 under normal operation are 15 dBm, when the measuring device 50 detects that signals outputted from the UUT 20 are 15 dBm, indicating that the UUT 20 operates normally. On the other hand, when the measuring device 50 detects that signals outputted from the UUT 20 are less than 15 dBm such as 10 dBm, indicating that the UUT 20 is operated abnormally (i.e., the UUT is defected or has been damaged). At that time, the user can replace the defected UUT 20 with a new UUT 20, so that the inter-stage test structure 200 can operate normally.

In summary, an exemplary embodiment of the present disclosure provides an inter-stage test structure, which can detect the condition of the component disposed in a wireless communication apparatus. Such that, when the inter-stage test structure detects a specific component is defected or has been damaged, a user can immediately replace the defected component with another component operated normally. Accordingly, the user only needs to replace change the defected or damaged component of the wireless communication apparatus, rather than scrapped the entire wireless communication apparatus, thereby considerably reduce the manufacturing costs associated with wireless communication apparatus.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. An inter-stage test structure for a wireless communication apparatus, the wireless communication apparatus having a unit under test (UUT), a first ground wire, a signal wire, a second ground wire, and a next-stage component, the UUT electrically connected to the next-stage component through the first ground wire, the signal wire, and the second ground wire, respectively, the inter-stage test structure comprising:
an upper board;
a lower board having a first ground pad, a first signal pad, and a second ground pad disposed thereon, the first ground pad electrically connected a first ground terminal of the UUT to a first ground terminal of the next-stage component through the first ground wire, the first signal pad electrically connected to a signal terminal of the UUT and a signal terminal of the next-stage component through the signal wire, and the second ground pad electrically connected a second ground terminal of the UUT and a second ground terminal of the next-stage component; and
an intermediate layer disposed between the upper board and the lower board, the intermediate layer having a first region and a second region defined thereon, the first region being in adjacent to the second region;
wherein the first region has an air cavity formed between the intermediate layer and the lower board, and air inside the air cavity generates an air impedance;
wherein, the second region has an impedance adjusting cavity formed between the intermediate layer and the lower board, and the impedance adjusting cavity comprises of a conductive paste, a ground plate, a substrate layer, and a metal plate; wherein the conductive paste being disposed on the lower board is configured to electrically connect the first ground pad to the second ground pad and the ground plate, the conductive paste has the ground plate, the substrate layer, and the metal plate sequentially disposed thereon, and the substrate layer has a predefined thickness for generating an adjustable impedance;
wherein the upper board has a third ground pad, a second signal pad, and a fourth ground pad disposed thereon, and the intermediate layer further has a first through-hole, a signal through-hole, and a second through-hole, wherein the third ground pad is disposed opposite to the first ground pad, the second signal pad is disposed opposite to the first board signal pad, and the fourth ground pad is disposed opposite to the second ground pad;
wherein the inter-stage test structure further comprises a first conductor, a signal conductor, and a second conductor, the first conductor is disposed in the first through-hole to electrically connect the third ground pad to the first ground pad, the signal conductor is disposed in the signal through-hole to electrically connect the first signal pad to second signal pad, and the second conductor is disposed in the second through-hole to electrically connect the fourth ground pad to the second ground pad;
wherein the inter-stage test structure further comprises a probing component having a first ground probe, a signal probe, and a second ground probe, the first ground probe electrically connects the third ground pad, the signal probe electrically connects the second signal pad, and the second ground probe electrically connects the fourth ground pad.

2. The inter-stage test structure according to claim 1, wherein the conductive paste is disposed around the second region and not disposed on the first region.

3. The inter-stage test structure according to claim 2, wherein the shape of the ground plate is configured to be the same as the shape of the conductive paste.

4. The inter-stage test structure according to claim 1, wherein the intermediate layer is formed from the first region and the second region and the first region has the same area as the second region.

5. The inter-stage test structure according to claim 1, wherein an equivalent impedance of the inter-stage test structure is determined by the air impedance and the adjustable impedance.

6. The inter-stage test structure according to claim 1, wherein the intermediate layer comprises of insulation material.

7. The inter-stage test structure according to claim 1, wherein the substrate layer comprises glass fiber.

* * * * *